United States Patent
Lin

(10) Patent No.: US 9,768,143 B2
(45) Date of Patent: *Sep. 19, 2017

(54) HYBRID BONDING WITH THROUGH SUBSTRATE VIA (TSV)

(71) Applicant: TAIWAN SEMICONDUCTOR MANUFACTURING CO., LTD., Hsin-Chu (TW)

(72) Inventor: Jing-Cheng Lin, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 23 days.

This patent is subject to a terminal disclaimer.

(21) Appl. No.: 14/488,017

(22) Filed: Sep. 16, 2014

(65) Prior Publication Data

US 2015/0021789 A1 Jan. 22, 2015

Related U.S. Application Data

(63) Continuation of application No. 13/943,401, filed on Jul. 16, 2013, now Pat. No. 8,860,229.

(51) Int. Cl.
*H01L 23/48* (2006.01)
*H01L 23/00* (2006.01)
(Continued)

(52) U.S. Cl.
CPC ........ *H01L 24/82* (2013.01); *H01L 21/76897* (2013.01); *H01L 21/76898* (2013.01);
(Continued)

(58) Field of Classification Search
CPC . H01L 25/0657; H01L 25/074; H01L 25/117; H01L 23/52; H01L 23/48;
(Continued)

(56) References Cited

U.S. PATENT DOCUMENTS 5,547,906 A 8/1996 Badehi
5,952,725 A 9/1999 Ball
(Continued)

OTHER PUBLICATIONS

U.S. Notice of Allowance for U.S. Appl. No. 15/076,141, dated Jul. 27, 2017.

*Primary Examiner* — Jose R Diaz
(74) *Attorney, Agent, or Firm* — Birch, Stewart, Kolasch & Birch, LLP

(57) ABSTRACT

A semiconductor device structure and method for forming the same are provided. The semiconductor device structure includes a first semiconductor wafer and a second semiconductor wafer bonded via a hybrid bonding structure, and the hybrid bonding structure includes a first conductive material embedded in a polymer material and a second conductive material embedded in a second polymer material. The first conductive material of the first semiconductor wafer bonded to the second conductive material of the second semiconductor wafer and the first polymer material of the first semiconductor wafer is bonded to the second polymer material of the second semiconductor wafer. The semiconductor device structure further includes at least one through substrate via (TSV) extending from a bottom surface of the second semiconductor wafer to a top surface of the first semiconductor wafer.

20 Claims, 6 Drawing Sheets

(51) Int. Cl.
*H01L 21/768* (2006.01)
*H01L 27/06* (2006.01)

(52) U.S. Cl.
CPC ............ *H01L 23/481* (2013.01); *H01L 24/02* (2013.01); *H01L 24/80* (2013.01); *H01L 27/0688* (2013.01); *H01L 2224/05547* (2013.01); *H01L 2224/05571* (2013.01); *H01L 2224/05624* (2013.01); *H01L 2224/05647* (2013.01); *H01L 2224/08147* (2013.01); *H01L 2224/80203* (2013.01); *H01L 2224/80357* (2013.01); *H01L 2224/80855* (2013.01); *H01L 2224/80895* (2013.01); *H01L 2224/80905* (2013.01); *H01L 2224/9202* (2013.01)

(58) Field of Classification Search
CPC ....... H01L 23/481; H01L 24/80; H01L 24/82; H01L 24/01; H01L 24/02; H01L 21/76897; H01L 21/76898; H01L 2225/06544; H01L 2225/06548
See application file for complete search history.

(56) References Cited

U.S. PATENT DOCUMENTS

| | | | |
|---|---|---|---|
| 6,448,661 B1 | 9/2002 | Kim et al. | |
| 7,354,798 B2 | 4/2008 | Pogge et al. | |
| 7,528,494 B2* | 5/2009 | Furukawa | H01L 21/76898 |
| | | | 257/777 |
| 7,791,175 B2 | 9/2010 | Pyeon | |
| 7,825,024 B2 | 11/2010 | Lin et al. | |
| 7,898,095 B2 | 3/2011 | Patti et al. | |
| 7,906,363 B2* | 3/2011 | Koyanagi | H01L 21/76898 |
| | | | 257/E21.513 |
| 7,943,428 B2 | 5/2011 | Gambino et al. | |
| 8,421,193 B2 | 4/2013 | Huang | |
| 8,563,403 B1* | 10/2013 | Farooq | H01L 24/80 |
| | | | 257/E21.597 |
| 8,729,711 B2* | 5/2014 | Nishio | H01L 21/3221 |
| | | | 257/773 |
| 8,860,229 B1* | 10/2014 | Lin | H01L 23/481 |
| | | | 257/686 |
| 9,087,821 B2* | 7/2015 | Lin | H01L 23/481 |
| 9,293,437 B2 | 3/2016 | Yu et al. | |
| 2007/0269978 A1 | 11/2007 | Shih et al. | |
| 2010/0178761 A1 | 7/2010 | Chen et al. | |
| 2011/0193240 A1* | 8/2011 | Farooq | B32B 15/20 |
| | | | 257/774 |
| 2011/0248396 A1 | 10/2011 | Liu et al. | |
| 2012/0193785 A1 | 8/2012 | Lin et al. | |
| 2012/0273940 A1* | 11/2012 | Jo | H01L 23/3128 |
| | | | 257/737 |
| 2012/0292784 A1 | 11/2012 | Nishio | |
| 2013/0020719 A1 | 1/2013 | Jung et al. | |
| 2013/0169355 A1 | 7/2013 | Chen et al. | |
| 2014/0117546 A1 | 5/2014 | Liu et al. | |
| 2014/0151895 A1 | 6/2014 | West et al. | |
| 2014/0264840 A1 | 9/2014 | Lin et al. | |
| 2015/0145144 A1* | 5/2015 | McDonald | H01L 25/0657 |
| | | | 257/774 |

* cited by examiner

HYBRID BONDING WITH THROUGH SUBSTRATE VIA (TSV)

CROSS REFERENCE TO RELATED APPLICATIONS

This application is a Continuation of U.S. application Ser. No. 13/943,401, filed on Jul. 16, 2013. The entirety of the above-identified application is expressly incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semi-conductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
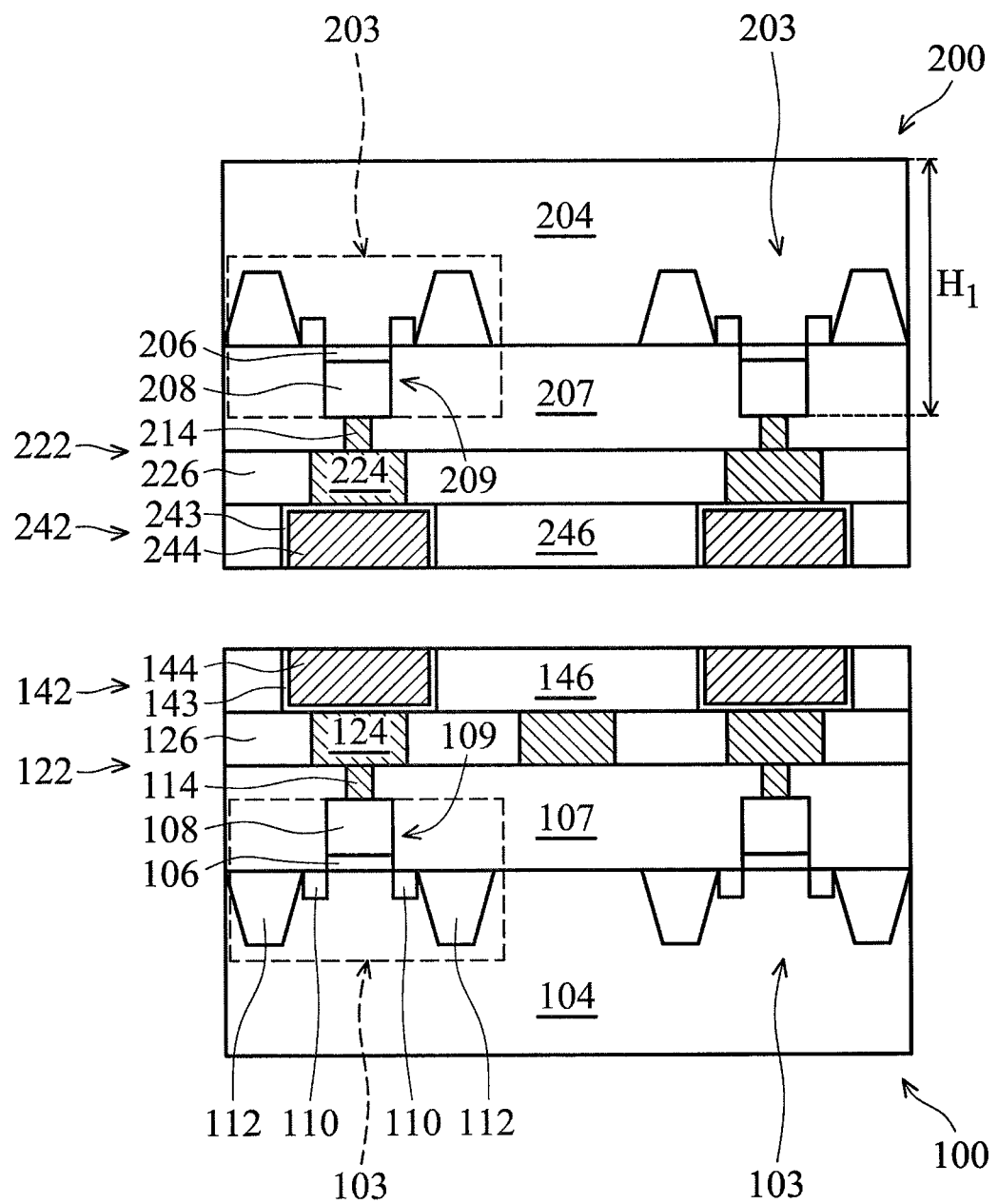
FIGS. 1-5 show cross-sectional representations of various stages of forming a semiconductor device, in accordance with some embodiments of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirect contact. FIGS. 1-5 show cross-sectional representations of various stages of forming a semiconductor device in accordance with some embodiments of the disclosure. Referring to FIG. 1, a cross-sectional representation of a portion of a semiconductor wafer 100 and a portion of another semiconductor wafer 200 are shown in accordance with some embodiments.

Semiconductor wafer 100 includes a semiconductor substrate 104, which may be made of silicon or other semiconductor materials. Alternatively or additionally, semiconductor substrate 104 may include other elementary semiconductor materials such as germanium. In some embodiments, semiconductor substrate 104 is made of a compound semiconductor such as silicon carbide, gallium arsenic, indium arsenide, or indium phosphide. In some embodiments, semiconductor substrate 104 is made of an alloy semiconductor such as silicon germanium, silicon germanium carbide, gallium arsenic phosphide, or gallium indium phosphide. In some embodiments, semiconductor substrate 104 includes an epitaxial layer. For example, semiconductor substrate 104 has an epitaxial layer overlying a bulk semiconductor.

Referring to FIG. 1, device regions 103 are formed in semiconductor wafer 100 in a front-end-of-line (FEOL) process in some embodiments. Each device regions 103 includes a gate structure 109 embedded in a dielectric layer 107, source/drain regions 110, and isolation structures 112, such as shallow trench isolation (STI) structures. Gate structure 109 includes a gate dielectric layer 106, a gate electrode 108, and possibly spacers (not shown). Device regions 103 shown in FIG. 1 are merely examples, and other structures may be formed in device regions 103.

Device regions 103 may form various N-type metal-oxide semiconductor (NMOS) and/or P-type metal-oxide semiconductor (PMOS) devices, such as transistors or memories, and the like, interconnected to perform one or more functions. Other devices, such as capacitors, resistors, diodes, photo-diodes, fuses, and the like may also be formed on substrate 104. The functions of the devices may include memory, processing, sensors, amplifiers, power distribution, input/output circuitry, or the like.

A metallization structure 122 is formed over substrate 104, e.g., over device regions 103. In some embodiments, metallization structure 122 includes interconnect structure, such as a contact plug 114 and conductive features 124. Conductive features 124 are embedded in an insulating material 126. Metallization structure 122 is formed in a back-end-of-line (BEOL) process in some embodiments. In some embodiments, insulating material 126 is made of silicon oxide. In some embodiments, insulating material 126 includes multiple dielectric layers of dielectric materials. One or more of the multiple dielectric layers are made of low dielectric constant (low-k) materials. In some embodiments, a top dielectric layer of the multiple dielectric layers is made of $SiO_2$. Metallization structure 122 shown is merely for illustrative purposes. Metallization structure 122 may include other configurations and may include one or more conductive lines and via layers.

A bonding structure 142 is formed over metallization structure 122. Bonding structure 142 includes a conductive material 144 and a polymer material 146. Conductive material 144 is formed in polymer material 146. Conductive material 144 is contact pads (or bond pads) formed on a top surface of semiconductor wafer 100. Conductive features 124 are connected to conductive material 144. Conductive material 144 may be made of conductive materials typically used in the BEOL process, such as copper (Cu), copper alloy, aluminum (Al), aluminum alloy, or combinations thereof. Other applicable materials may be used as conductive material 144.

In some embodiments, if conductive material 144 is made of a metal, such as copper, which is easy to diffuse, a diffusion barrier layer 143 is needed. Diffusion barrier layer 143 may be made of silicon nitride (SiN), silicon oxynitride (SiON), titanium nitride (TiN), tantalum nitride (TaN) or aluminum nitride (AlN). In some embodiments, conductive material 144 is made of copper, and diffusion barrier layer 143 includes TaN/Ta bi-layer. In some embodiments, diffusion barrier layer 143 has a thickness in a range from about 5 Å to about 1000 Å.

In some embodiments, polymer material 146 is benzocyclobutene (BCB) polymer, polyimide (PI), or polybenzoxazole (PBO). In some embodiments, polymer material 146 is benzocyclobutene (BCB) polymer and is applied to metallization structure 122 by spin coating. Since benzocyclobutene polymer is a soft material, it can tolerant more stress resulting from the TSV formed in the subsequent processes compared to other dielectric materials such as silicon dioxide.

Semiconductor wafer 200 is similar to semiconductor wafer 100. Semiconductor wafer 200 includes a substrate 204 and device regions 203. Substrate 204 is similar to substrate 104. Device regions 203 are similar to device regions 103 and include a gate structure 209, source/drain regions 210, and isolation structures 212. Gate structure 209 is similar to gate structure 109 and includes a gate dielectric layer 206, a gate electrode 208, and possibly spacers (not shown). Gate dielectric layer 206 is similar to gate dielectric layer 106, and gate electrode 208 is similar to gate electrode 108. In addition, source/drain regions 210 in devices 203 are similar to source/drain regions 110, and isolation structures 212 in devices 203 are similar to isolation structures 112.

Semiconductor wafer 200 further includes a metallization structure 222 and a bonding structure 242. Metallization structure 222 is similar to metallization structure 122 and includes a contact plug 214 embedded in a dielectric layer 207 and conductive features 224 embedded in an insulating material 226. Contact plug 214 is similar to contact plug 114, and dielectric layer 207 is similar to dielectric layer 107. Conductive features 224 are similar to conductive features 124, and insulating material 226 is similar to insulating material 126. Bonding structure 242 is similar to bonding structure 142 and includes a conductive material 244 and a polymer material 246. Conductive material 244 is similar to conductive material 144, and polymer material 246 is similar to polymer material 146. Metallization structure 222 may further include a diffusion barrier layer 243 which is similar to diffusion barrier layer 143.

As shown in FIG. 1, semiconductor wafer 200 has a height $H_1$ from a bottom surface of semiconductor substrate 204 to a top surface of gate structure 209 in a range from about 1.0 μm to about 20 μm.

Before semiconductor wafer 100 is bonded to semiconductor 200, semiconductor wafers 100 and 200 are aligned, such that conductive material 144 on semiconductor wafer 100 can be bonded to conductive material 244 on semiconductor wafer 200 and polymer material 146 on semiconductor wafer 100 can be bonded to polymer material 246 on semiconductor wafer 200. In some embodiments, the alignment of semiconductor wafers 100 and 200 may be achieved by using an optical sensing method.

Figure 2:
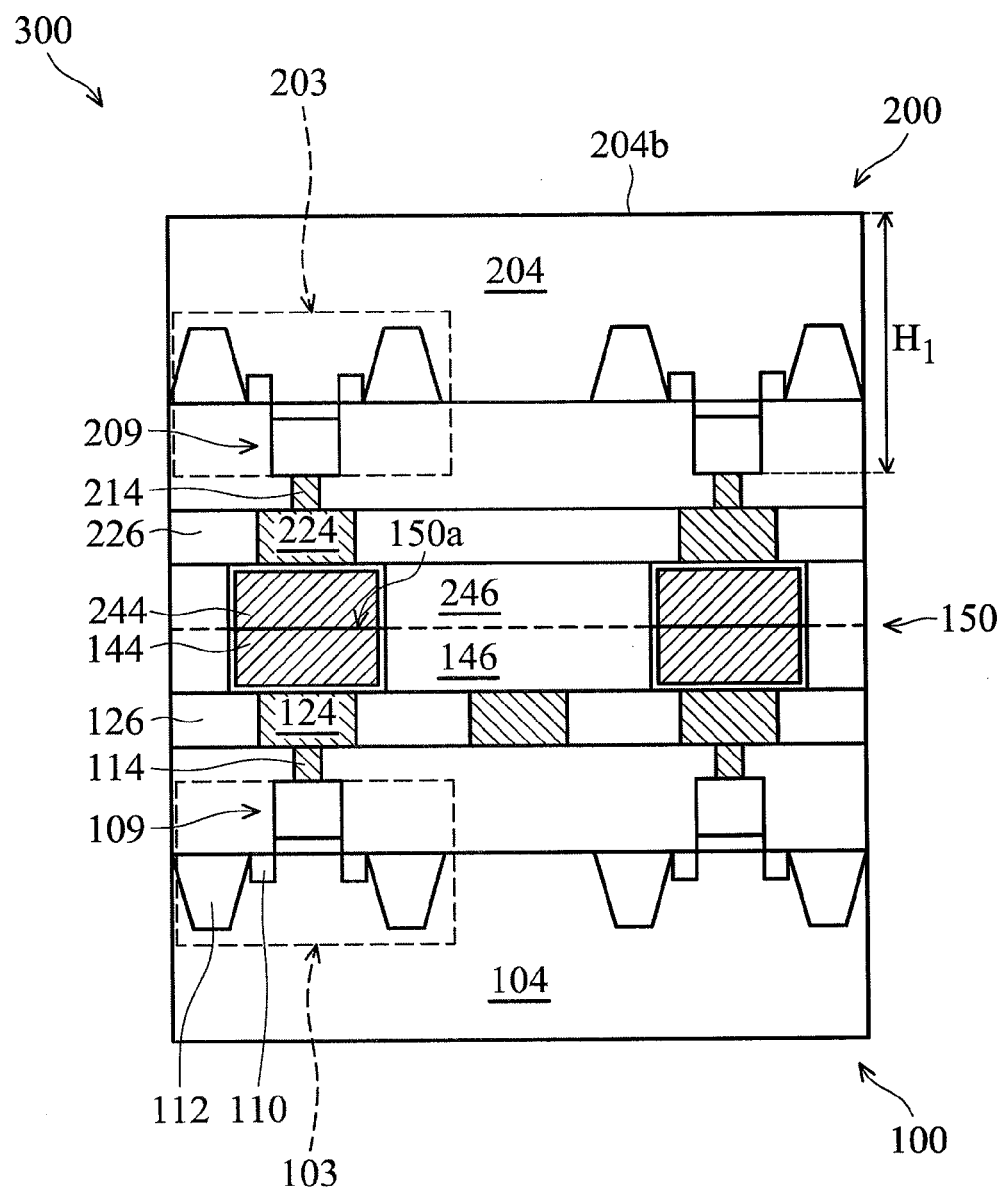

Referring to FIG. 2, after the alignment is performed, semiconductor wafers 100 and 200 are bonded together by hybrid bonding to form a 3DIC stacking structure 300. Semiconductor wafers 100 and 200 are hybrid bonded together by the application of pressure and heat. In some embodiments, during hybrid bonding, stacking structure 300 is heated to a temperature in a range from about 100° C. to about 200° C., such that polymer materials 146 and 246 become a non-confined viscous liquid and are reflowed. By reflowing polymer materials 146 and 246, voids therein are eliminated.

Afterwards, stacking structure 300 are further heated to a higher temperature in a range from about 220° C. to about 380° C., such that conductive materials 144 and 244 are interconnected by thermocompression bonding and polymer materials 146 and 246 are fully cured. In some embodiments, the pressure for hybrid bonding is in a range from about 0.7 bar to about 10 bar. The hybrid bonding process may be performed in an inert environment, such as an environment filled with inert gas including $N_2$, Ar, He, or combinations thereof.

As shown in FIG. 2, hybrid bonding involves at least two types of bondings, including metal-to-metal bonding and non-metal-to-non-metal bonding. As shown in FIG. 2, a hybrid bonding structure 150 is formed between semiconductor wafers 100 and 200. Hybrid bonding structure 150 includes conductive materials 144 and 244 bonded by metal-to-metal bonding and polymer materials 146 and 246 bonded by non-metal-to-non-metal bonding. As shown in FIG. 2, bonding structure 150 has a metallic bonding interface 150a between conductive materials 144 and 244 but may not have a clear non-metallic interface between polymer materials 146 and 246 due to the reflowing process.

Compared to hybrid bonding involving other dielectric layer, semiconductor wafers 100 and 200 are bonded through polymer materials 146 and 246. Since bonding of polymer materials 146 and 246 involves reflowing and intermixing of polymer materials 146 and 246, voids in polymer materials 146 and 246 are eliminated and bonding strength of semiconductor wafers 100 and 200 is improved. In addition, hybrid bonding of semiconductor wafers 100 and 200 which are bonded through polymer materials 146 and 246 can be performed at a relatively low temperature.

Figure 3:
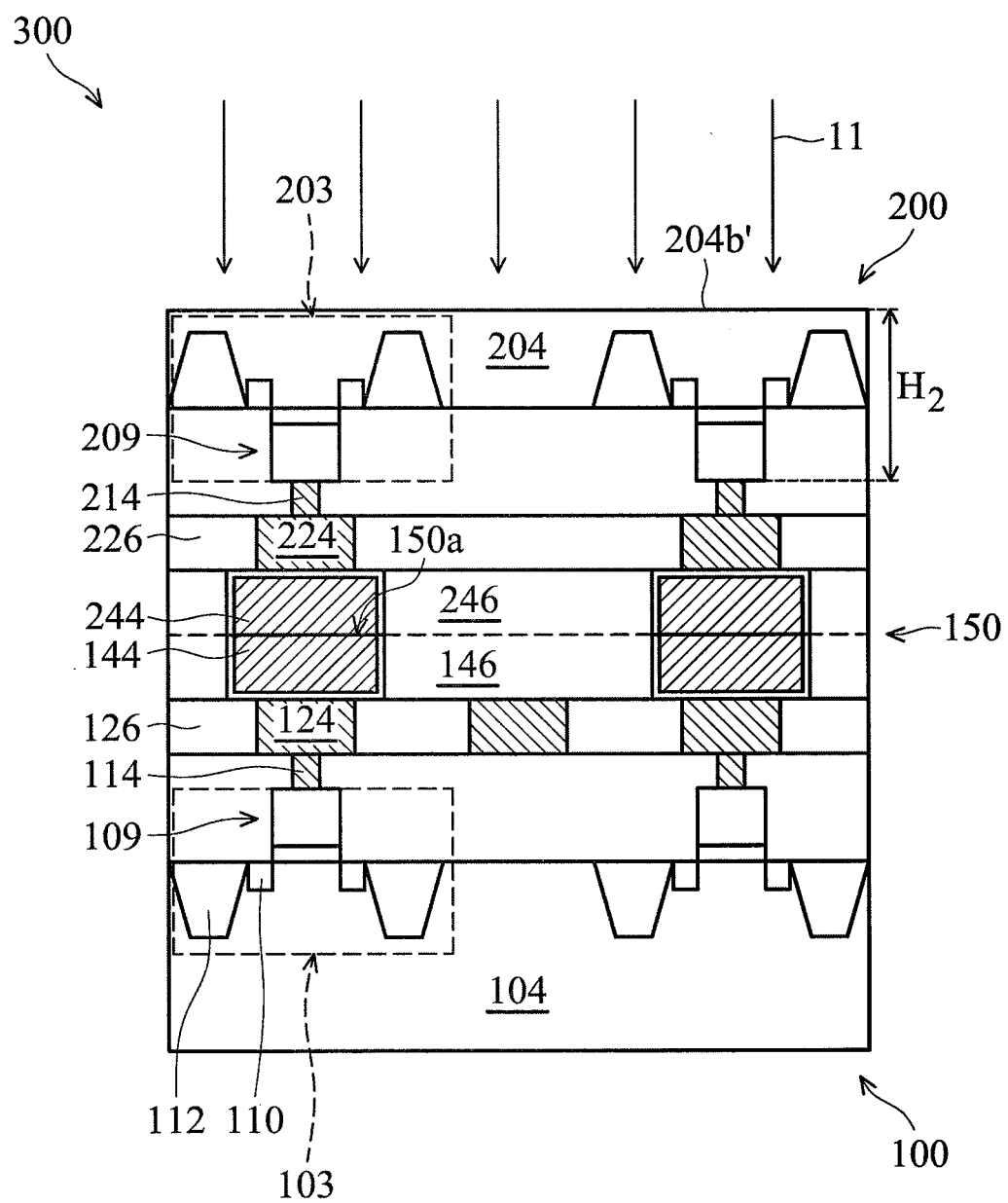

Referring to FIG. 3, after hybrid bonding, stacking structure 300 is put on a tape (not shown) and a thinning process 11 is performed on a bottom surface 204b' of semiconductor wafer 200. Thinning process 11 may include a grinding operation and a polishing operation (such as chemical mechanical polishing (CMP)). After thinning process 11, a wet etching operation is performed to remove the defects formed on bottom surface 204b of semiconductor wafer 200. After thinning process 11, semiconductor wafer 200 has a height $H_2$ from bottom surface 204b of semiconductor substrate 204 to a top surface of gate structure 209 in a range from about 0.2 μm to about 5 μm. Height $H_2$ is smaller than height $H_1$. In some embodiments, and height $H_2$ is in a range from about 0.01 to about 0.99 of height $H_1$.

Figure 4:
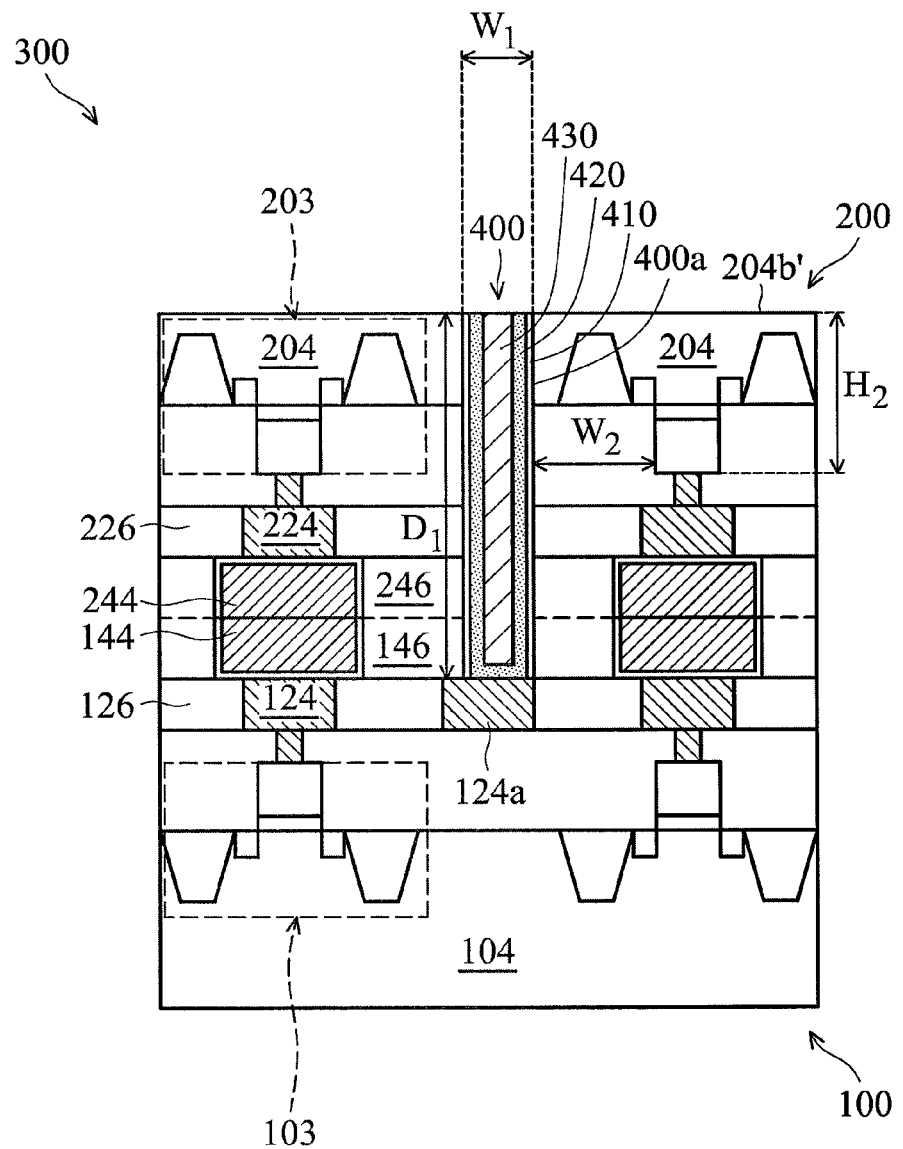

After thinning process 11, referring to FIG. 4, a through-substrate via (TSV) 400 is formed through second semiconductor wafer 200. Through-substrate via (TSV) 400 is used to provide electrical connections and for heat dissipation for 3DICs. As shown in FIG. 4, TSV 400 is used to connect a conductive feature 124a on semiconductor wafer 100 to backside of semiconductor wafer 200. Although FIG. 4 only shows one TSV, more than one TSV, may be formed to pass through semiconductor wafer 200.

TSV 400 includes a liner 410, a diffusion barrier layer 420, and a conductive via material 430. TSV 400 is formed by the following operations. Firstly, stacking structure 300 is patterned and a TSV opening is formed extending through semiconductor wafer 200 to expose a portion of a conductive feature 124a of semiconductor wafer 100 by one or more etching processes. After the TSV opening is formed, a liner 410 is formed on sidewalls of the TSV opening to act as an isolation layer such that conductive materials for TSV 400 and semiconductor substrate 204 do not directly contact each other. Afterwards, a diffusion barrier layer 420 is conformally formed on liner 410. Diffusion barrier layer 420 is used to prevent conductive via material 430 which is formed later from migrating to device regions 103 and 203. Afterwards, conductive via material 430 is used to fill into the TSV opening.

Liner 410 is made of an insulating material, such as oxides or nitrides. Liner 410 may be formed by using a plasma enhanced chemical vapor deposition (PECVD) process or other applicable processes. Liner 410 may be a single layer or multi-layers. In some embodiments, liner 410 has a thickness in a range from about 100 Å to about 5000 Å.

Diffusion Barrier layer 420 is made of Ta, TaN, Ti, TiN, or CoW. In some embodiments, diffusion barrier layer 420 is formed by a physically vapor deposition (PVD) process. Conductive via material 430 is made of copper, copper alloy, aluminum, alloys, or combinations thereof. Alternatively, other applicable materials may be used. In some embodiments, conductive via material 430 is formed by plating.

Once the TSV opening has been filled, excess liner 410, diffusion barrier layer 420, and conductive via material 430 outside of the TSV opening is removed by a planarization process such as a chemical mechanical polishing (CMP) process, although any suitable removal process may be used.

As shown in FIG. 4, in some embodiments, TSV 400 has a width $W_1$ in a range from about 0.025 µm to about 2 µm. In some embodiments, TSV 400 has a depth $D_1$ in a range from about 0.2 µm to about 10 µm. In some embodiments, TSV 400 has an aspect ratio $(D_1/W_1)$ in a range from about 2 to about 15.

If a TSV similar to TSV 400 is formed in semiconductor wafer 200 with a height $H_1$ as shown in FIG. 2, the TSV will have a higher aspect ratio than TSV 400. With high aspect ratio, filling materials into the TSV opening becomes challenging. Voids may form in the TSV opening. In addition, due to insufficient sidewall coverage of liner 410 or diffusion barrier layer 420, some extrusion or diffusion problems related to conductive via material 430 may occur. In contrast, as shown in FIG. 4, since the height of semiconductor wafer 200 is reduced from $H_1$ to $H_2$, TSV 400 has a relative smaller aspect ratio. Therefore, the void problems and the extrusion or diffusion problems related to the conductive via material 430 are resolved or greatly reduced. In addition, the overall package height of 3DIC stacking structure 300 is reduced to meet advanced packaging requirements. Therefore, 3DIC stacking structure 300 achieves small form factor.

In addition, devices in the vicinity of the TSV suffer from serious performance degradation due to the stress induced by the TSV. A keep-out zone (KOZ) is used to define a region where no devices could be placed within. In some embodiments, keep-out zone (KOZ) is defined by a distance $W_2$, which is measured from a sidewall 400a of TSV 400 to a nearest gate structure 209. Since semiconductor wafer 200 has a relatively small height $H_2$ due to thinning, the depth $D_1$ of TSV 400 is made smaller, resulting in a smaller width $W_1$. Therefore, overall stress induced by TSV 400 is reduced, and distance $W_2$ is also made smaller in FIG. 5. In some embodiments, distance $W_2$ is in a range from 0.01 µm to about 3 µm. When distance $W_2$ is smaller, a larger area of device regions 103 may be used. As a result, integrated intensity of devices in device regions 103 is further improved.

Figure 5:
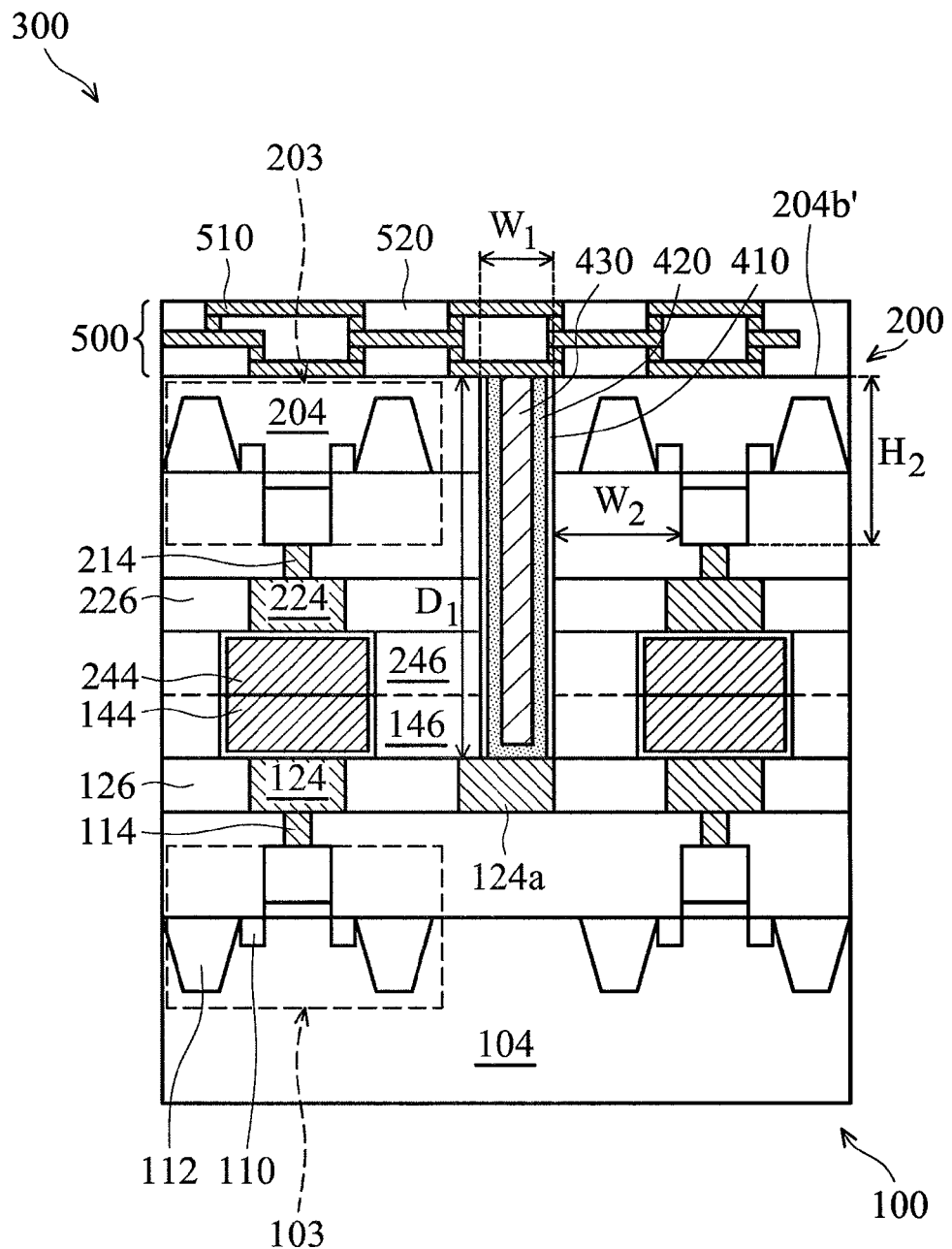

Referring to FIG. 5, an interconnect structure 500 is formed on bottom surface 204b of semiconductor wafer 200. Interconnect structure 500 is electrically connected to conductive features 124a on semiconductor wafer 100 via TSV 400. Interconnect structure 500 includes conductive features 510, such as conductive lines, vias, or conductive pads, formed in an insulating material 520. Metal routing of conductive features shown in FIG. 5 is merely an example. Alternatively, other designs of metal routing of conductive features may be used according to actual application.

As shown in FIG. 5, TSV 400 is directly connected to conductive features 124a on semiconductor wafer 100. Therefore, metal routing bypasses the interconnect structures of semiconductor wafer 200, such as conductive features 224 and contact plug 244. Since TSV 400 has a relatively low resistance, RC delay is reduced. In addition, TSV 400 is formed after semiconductor wafers 100 and 200 are bonded. If a TSV on semiconductor wafer 200 is formed before two wafers are bonded, semiconductor wafer 200 needs to be thick to avoid breakage during subsequent processes. Therefore, semiconductor wafer 200 can not be thinned. However, if semiconductor wafer 200 is thick, the TSV formed in the semiconductor wafer 200 will have a large diameter. The TSV will be large and cause lots of stress in the surrounding areas. In contrast, TSV 400 described here is formed after semiconductor wafers 100 and 200 are bonded. Such bonding enables the thinning of backside 204b of substrate 204 of semiconductor wafer 200. As a result, TSV 400 is able to have a smaller depth $D_1$ and a smaller width $W_1$. Therefore, TSV 400 causes relatively low stress into the surrounding areas.

In addition, other processes may also be performed to 3DIC stacking structure 300, and 3DIC stacking structure 300 may be diced to form individual chips afterwards.

Figure 6:
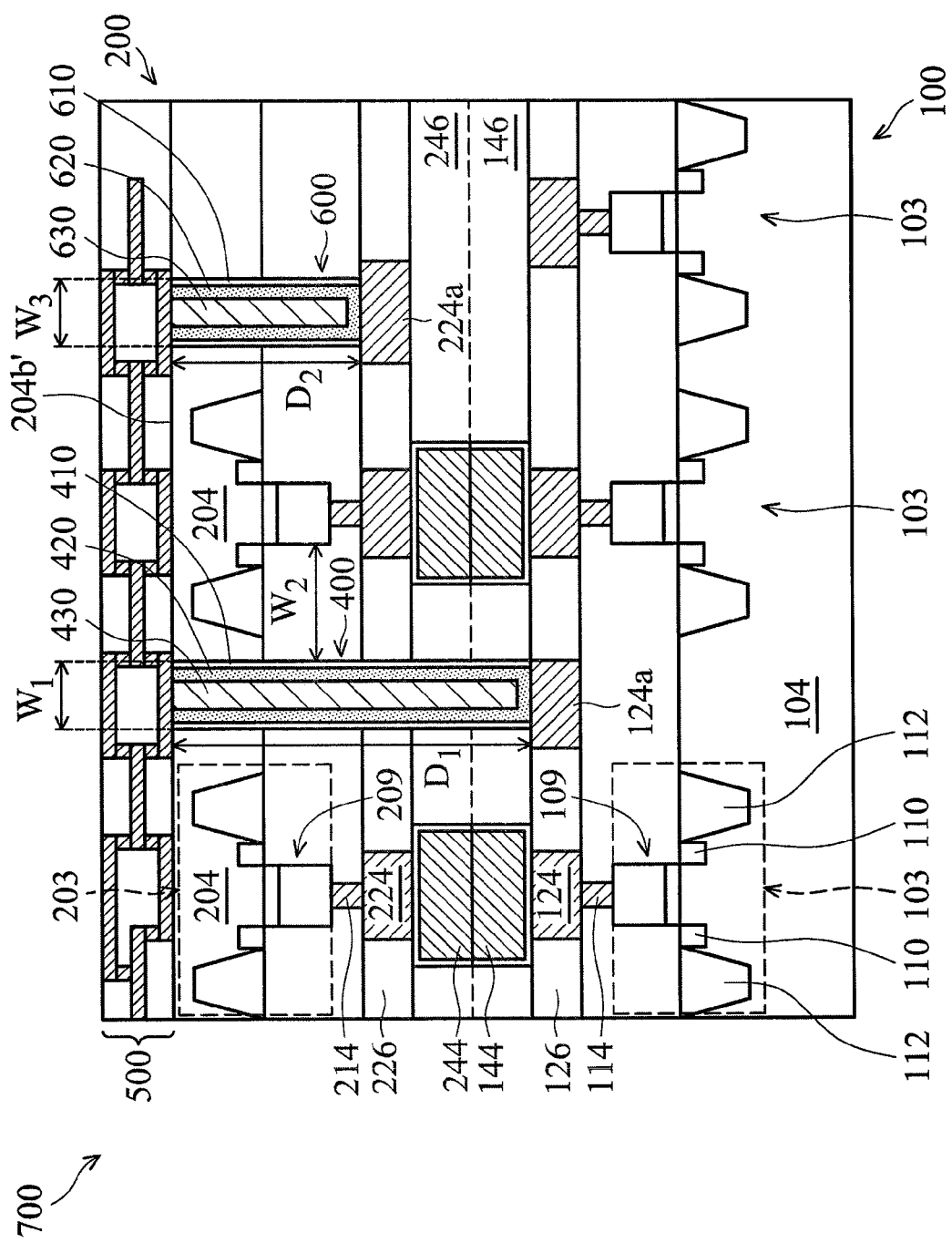
FIG. 6 shows a cross-sectional representation of a 3DIC stacking structure, in accordance with some embodiments of the disclosure.

FIG. 6 shows a cross-section representation of a 3DIC stacking structure 700 in accordance with some embodiments. As shown in FIG. 6, the 3DIC stacking structure 700 in FIG. 6 is almost the same with 3DIC stacking structure 300 except an additional TSV 600 is formed in semiconductor wafer 200. The formation of stacking structure 700 may involve additional patterning and etching processes. For example, a first TSV opening is formed through semiconductor wafer 200 to expose a portion of a metal pad 224a of semiconductor wafer 200. After the first TSV opening is formed, a second opening is formed through semiconductor wafer 200 to expose a portion of metal pad 124a of semiconductor wafer 100. Afterwards, liners 610 and 410, diffusion barrier layers 620 and 420, and conductive via materials 630 and 430 are used to fill in the first and second TSV openings to form TSVs 600 and 400. As shown in FIG. 6, TSV 600 includes liner 610 similar to liner 410, diffusion barrier layer 620 similar to diffusion layer 420, and conductive via material 630 similar to conductive via material 430, but TSV 600 only extends to metal pad 224a of semiconductor wafer 200. Therefore, TSV 600 is smaller than TSV 400.

In some embodiments, TSV 600 has a width $W_3$ in a range from about 0.03 μm to about 2 μm. In some embodiments, TSV 600 has a depth $D_2$ in a range from about 0.19 μm to about 9.9 μm. In some embodiments, TSV 600 has an aspect ratio ($D_2/W_3$) in a range from about 2 to about 15.

Embodiments of mechanisms of forming a die stack are provided. Two semiconductor wafers are bonded together by hybrid bonding with metal-to-meal bonding and polymer-to-polymer bonding to form the die stack. A TSV and an interconnect structure are formed on the backside of a wafer to provide electrical connection with devices in the die stack. Therefore, the TSV has a relatively small size and has a relatively small keep out zone (KOZ). In addition, polymer-to-polymer bonding is strong, and the polymer material is soft to provide cushion to absorb the stress resulting form the TSV.

In some embodiments, a semiconductor device structure is provided. The semiconductor device structure includes a first semiconductor wafer and a second semiconductor wafer bonded via a hybrid bonding structure, and the hybrid bonding structure includes a first conductive material embedded in first a polymer material and a second conductive material embedded in a second material. The first conductive material of the first semiconductor wafer is bonded to the second conductive material of the second semiconductor wafer, and the first polymer material of the first semiconductor wafer is bonded to the second polymer material of the second semiconductor wafer. The semiconductor device structure further includes one or more TSVs extending from a bottom surface of the second semiconductor wafer to a top surface of the first semiconductor wafer.

In some embodiments, a semiconductor device structure is provided. The semiconductor device structure includes a first semiconductor wafer and a second semiconductor wafer bonded via a hybrid bonding structure, and the hybrid bonding structure includes a first conductive material embedded in a first polymer material and a second conductive material embedded in a second polymer material. The first conductive material of the first semiconductor wafer is bonded to the second conductive material of the second semiconductor wafer, and the first polymer material of the first semiconductor wafer is bonded to the second polymer material of the second semiconductor wafer. The semiconductor device structure further includes one or more TSVs extending from a bottom surface of the second semiconductor wafer to a top surface of the first semiconductor wafer, and the through substrate via (TSV) has an aspect ratio in a range from 2 to about 15.

In some embodiments, a method for forming a semiconductor device structure is provided. The method includes providing a first semiconductor wafer and a second semiconductor wafer, and hybrid bonding the first semiconductor wafer and the second semiconductor wafer. The method also includes thinning the second semiconductor wafer from a bottom surface of the second semiconductor wafer. The method further includes forming one or more through substrate vias (TSVs) through the second semiconductor wafer, and the TSVs extend from the bottom surface of the second semiconductor wafer to the top surface of the first semiconductor wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a first semiconductor wafer and a second semiconductor wafer bonded via a hybrid bonding structure, wherein the hybrid bonding structure comprises a metallic bonding interface between two conductive materials and a polymer-to-polymer bonding structure, the first semiconductor wafer comprises a first transistor with a gate facing toward a top surface of the first semiconductor wafer and facing away from a bottom surface of the first semiconductor wafer, and the second semiconductor wafer comprises a second transistor with a gate facing toward a top surface of the second semiconductor wafer and facing away from a bottom surface of the second semiconductor wafer, and the top surface of the first semiconductor wafer is bonded to the top surface of the second semiconductor wafer; and
at least one through substrate via (TSV) extending from the bottom surface of the second semiconductor wafer to the top surface of the first semiconductor wafer, wherein the TSV is through the polymer-to-polymer bonding structure, and the TSV has a first end and a second end, the first end stops at the bottom surface of the second semiconductor wafer and the second end stops at the top surface of the first semiconductor wafer.

2. The semiconductor device structure as claimed in claim 1, further comprising:
an interconnect structure formed over a bottom surface of the second semiconductor wafer.

3. The semiconductor device structure as claimed in claim 1, wherein the first semiconductor wafer has a first height, and the second semiconductor wafer has a second height, and the second height is smaller than the first height.

4. The semiconductor device structure as claimed in claim 1, wherein the TSV has an aspect ratio in a range from about 2 to about 15.

5. The semiconductor device structure as claimed in claim 1, wherein the TSV further comprises:
a liner formed on a sidewall of a TSV opening;
a diffusion barrier layer conformally formed on the liner; and
a conductive via material formed on the diffusion barrier layer.

6. The semiconductor device structure as claimed in claim 1, wherein the second semiconductor wafer has a height in a range from about 0.2 μm to about 5 μm.

7. The semiconductor device structure as claimed in claim 1, wherein the TSV directly contacts a top surface of a conductive feature of the first semiconductor wafer, and the top surface of the conductive feature is coplanar with the top surface of the first semiconductor wafer.

8. The semiconductor device structure as claimed in claim 1, wherein the hybrid bonding structure comprises:
- a first conductive material embedded in a first polymer material; and
- a second conductive material embedded in a second polymer material, wherein the first conductive material of the first semiconductor wafer is bonded to the second conductive material of the second semiconductor wafer and the first polymer material of the first semiconductor wafer is bonded to the second polymer material of the second semiconductor wafer.

9. The semiconductor device structure as claimed in claim 1, wherein a keep-out zone (KOZ) defines a region where no active device is placed within, and a distance defined by the KOZ is measured from the sidewall of the TSV to an active device is in a range from about 0.01 μm to about 3 μm.

10. A semiconductor device structure, comprising:
- a first semiconductor wafer and a second semiconductor wafer bonded via a hybrid bonding structure, wherein the hybrid bonding structure comprises a metallic bonding interface between two conductive materials and a polymer-to-polymer bonding structure, the first semiconductor wafer comprises a first transistor with a gate facing toward a top surface of the first semiconductor wafer and facing away from a bottom surface of the first semiconductor wafer, and the second semiconductor wafer comprises a second transistor with a gate facing toward a top surface of the second semiconductor wafer and facing away from a bottom surface of the second semiconductor wafer, and the top surface of the first semiconductor wafer is bonded to the top surface of the second semiconductor wafer; and
- at least one TSV passing through the second semiconductor wafer, wherein the TSV has an aspect ratio in a range from about 2 to about 15, and the TSV is through the polymer-to-polymer bonding structure, and the TSV has a first end and a second end, the first end stops at the bottom surface of the second semiconductor wafer and the second end stops at the top surface of the first semiconductor wafer.

11. The semiconductor device structure as claimed in claim 10, wherein a KOZ defines a region where no active device is placed within, and a distance defined by the KOZ is measured from the center of TSV to an active device is in a range from about 0.01 μm to about 3 μm.

12. The semiconductor device structure as claimed in claim 10, wherein the hybrid bonding structure comprises:
- a first conductive material embedded in a first polymer material; and
- a second conductive material embedded in a second polymer material, wherein the first conductive material of the first semiconductor wafer is bonded to the second conductive material of the second semiconductor wafer and the first polymer material of the first semiconductor wafer is bonded to the second polymer material of the second semiconductor wafer.

13. The semiconductor device structure as claimed in claim 12, wherein the first polymer material and the second polymer material are respectively benzocyclobutene (BCB) polymer, polyimide (PI), or polybenzoxazole (PBO).

14. A semiconductor device structure, comprising:
- a first semiconductor wafer and a second semiconductor wafer bonded via a hybrid bonding structure with a metallic bonding interface between two conductive materials and a polymer-to-polymer bonding structure, wherein the first semiconductor wafer comprises a first transistor with a gate facing toward a top surface of the first semiconductor wafer and facing away from a bottom surface of the first semiconductor wafer, and the second semiconductor wafer comprises a second transistor with a gate facing toward a top surface of the second semiconductor wafer and facing away from a bottom surface of the second semiconductor wafer, and the top surface of the first semiconductor wafer is bonded to the top surface of the second semiconductor wafer;
- a first TSV passing through the hybrid bonding structure with a polymer-to-polymer bonding structure; and
- a first interconnect structure formed over the first semiconductor wafer, wherein the first TSV is electrically connected to the interconnect structure, wherein the first TSV has a first end and a second end, the first end stops at the bottom surface of the second semiconductor wafer and the second end stops at the top surface of the first semiconductor wafer.

15. The semiconductor device structure as claimed in claim 14, wherein the first TSV is in direct contact with a top surface of the conductive feature of the first interconnect structure, and the top surface of the conductive feature is coplanar with the top surface of the first semiconductor wafer.

16. The semiconductor device structure as claimed in claim 14, wherein the hybrid bonding structure comprises:
- a first conductive material embedded in a first polymer material; and
- a second conductive material embedded in a second polymer material, wherein the first conductive material of the first semiconductor wafer is bonded to the second conductive material of the second semiconductor wafer and the first polymer material of the first semiconductor wafer is bonded to the second polymer material of the second semiconductor wafer.

17. The semiconductor device structure as claimed in claim 14, wherein the first semiconductor wafer has a first height, and the second semiconductor wafer has a second height, and the second height is smaller than the first height.

18. The semiconductor device structure as claimed in claim 14, further comprising:
- a second interconnect structure formed over the second semiconductor wafer, wherein the first TSV is electrically connected to the second interconnect structure.

19. The semiconductor device structure as claimed in claim 18, further comprising:
- a second TSV formed through the second semiconductor wafer, wherein the second TSV is electrically connected to the second interconnect structure and a conductive feature, and the conductive feature is in direct contact with the hybrid bonding structure.

20. The semiconductor device structure as claimed in claim 14, wherein the first TSV further comprises:
- a liner formed on a sidewall of a first TSV opening;
- a diffusion barrier layer conformally formed on the liner; and
- a conductive via material formed on the diffusion barrier layer.

* * * * *